United States Patent
Sugiyama et al.

(10) Patent No.: US 9,130,098 B2
(45) Date of Patent: Sep. 8, 2015

(54) SEMICONDUCTOR LIGHT EMITTING DEVICE

(75) Inventors: Naoharu Sugiyama, Kanagawa-ken (JP); Tomonari Shioda, Kanagawa-ken (JP); Hisashi Yoshida, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 532 days.

(21) Appl. No.: 13/212,539

(22) Filed: Aug. 18, 2011

(65) Prior Publication Data

US 2012/0146045 A1    Jun. 14, 2012

(30) Foreign Application Priority Data

Dec. 8, 2010  (JP) .................................. 2010-273587

(51) Int. Cl.
  *H01L 27/15*    (2006.01)
  *H01L 33/06*    (2010.01)
  *H01L 33/12*    (2010.01)
  *H01L 33/32*    (2010.01)
  *H01L 33/46*    (2010.01)

(52) U.S. Cl.
  CPC ................ *H01L 33/06* (2013.01); *H01L 33/12* (2013.01); *H01L 33/32* (2013.01); *H01L 33/46* (2013.01)

(58) Field of Classification Search
  None
  See application file for complete search history.

(56) References Cited

U.S. PATENT DOCUMENTS

| | | | | |
|---|---|---|---|---|
| 4,985,742 A | * | 1/1991 | Pankove | 257/197 |
| 5,667,586 A | * | 9/1997 | Ek et al. | 117/84 |
| 5,900,650 A | * | 5/1999 | Nitta | 257/94 |
| 2002/0030200 A1 | * | 3/2002 | Yamaguchi et al. | 257/184 |
| 2004/0053438 A1 | * | 3/2004 | Abe et al. | 438/93 |
| 2006/0233211 A1 | * | 10/2006 | Edmond et al. | 372/43.01 |
| 2006/0236923 A1 | * | 10/2006 | Kouvetakis et al. | 117/108 |
| 2007/0110657 A1 | * | 5/2007 | Hunter | 423/345 |
| 2007/0241350 A1 | * | 10/2007 | Kim | 257/90 |
| 2009/0045393 A1 | * | 2/2009 | Nakahara | 257/13 |
| 2009/0059406 A1 | * | 3/2009 | Powers et al. | 359/889 |
| 2009/0127540 A1 | * | 5/2009 | Taylor | 257/14 |
| 2009/0166658 A1 | * | 7/2009 | Slater et al. | 257/98 |

(Continued)

FOREIGN PATENT DOCUMENTS

| | | |
|---|---|---|
| JP | 2003-8061 | 1/2003 |
| JP | 2004-524250 | 8/2004 |

(Continued)

OTHER PUBLICATIONS

Fujikawa et al "Silicon on Insulator for Symmetry-Converted Growth." Applied Physics Letters 90(2007): 243107-1 to 243107-3.*

(Continued)

*Primary Examiner* — Fei Fei Yeung Lopez
(74) *Attorney, Agent, or Firm* — Oblon, McClelland, Maier & Neustadt, L.L.P.

(57) ABSTRACT

According to one embodiment, a semiconductor light emitting device includes a light emitting layer, a light transmitting layer and a first semiconductor layer. The light transmitting layer is transmittable with respect to light emitted from the light emitting layer. The first semiconductor layer contacts the light transmitting layer between the light emitting layer and the light transmitting layer. The light transmitting layer has a thermal expansion coefficient larger than a thermal expansion coefficient of the light transmitting layer, has a lattice constant smaller than a lattice constant of the active layer, and has a tensile stress in an in-plane direction.

22 Claims, 8 Drawing Sheets

(56) References Cited

U.S. PATENT DOCUMENTS

| | | | |
|---|---|---|---|
| 2009/0174035 A1* | 7/2009 | Kano et al. | 257/615 |
| 2009/0298212 A1* | 12/2009 | Pan | 438/42 |
| 2009/0302474 A1* | 12/2009 | Barmak et al. | 257/751 |
| 2010/0032717 A1* | 2/2010 | Palacios et al. | 257/194 |
| 2010/0140636 A1* | 6/2010 | Donofrio et al. | 257/98 |
| 2010/0140745 A1* | 6/2010 | Khan et al. | 257/615 |
| 2010/0219488 A1* | 9/2010 | Nakatani et al. | 257/414 |
| 2010/0307418 A1* | 12/2010 | Iso et al. | 118/725 |
| 2012/0103419 A1* | 5/2012 | Pimputkar et al. | 136/262 |

FOREIGN PATENT DOCUMENTS

| | | |
|---|---|---|
| JP | 2005-89607 A | 4/2005 |
| JP | 2006-93686 A | 4/2006 |
| JP | 2006-100787 | 4/2006 |
| JP | 2007-36233 | 2/2007 |
| JP | 2008-182110 | 8/2008 |
| JP | 2008-288543 A | 11/2008 |
| JP | 2009-59734 | 3/2009 |
| JP | 2009-188249 | 8/2009 |
| JP | 2009-260316 A | 11/2009 |
| JP | 2010-212738 | 9/2010 |
| JP | 2010-534931 A | 11/2010 |
| JP | 2010-287761 A | 12/2010 |
| WO | PCT/JP2008/002430 * | 3/2009 |
| WO | WO 2009/051650 A1 | 4/2009 |

OTHER PUBLICATIONS

U.S. Appl. No. 13/037,582, filed Mar. 1, 2011, Naoharu Sugiyama, et al.

Office Action issued Oct. 28, 2011 in Japan Application No. 2010-273587 (With English Translation).

Office Action issued Jan. 30, 2012, in Japanese Patent Application No. 2010-273587 (with English-language translation).

Office Action issued May 29, 2013, in Japanese Patent Application No. 2011-281296 with English translation.

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2010-273587, filed on Dec. 8, 2010; the entire contents of which are incorporated herein by reference.

FIELD

Embodiments described herein relate generally to a semiconductor light emitting device.

BACKGROUND

A compound semiconductor has been used for a high speed electronic device represented by a high frequency device, an optical device represented by a light emitting or light receiving device or the like in a variety of fields. For example, a semiconductor light emitting device such as a light emitting diode (LED), a laser diode (LD) using a nitride semiconductor has been made into practical use. For such semiconductor light emitting device, improvements in light emission efficiency and light extraction efficiency have been desired.

DETAILED DESCRIPTION

Figure 1:
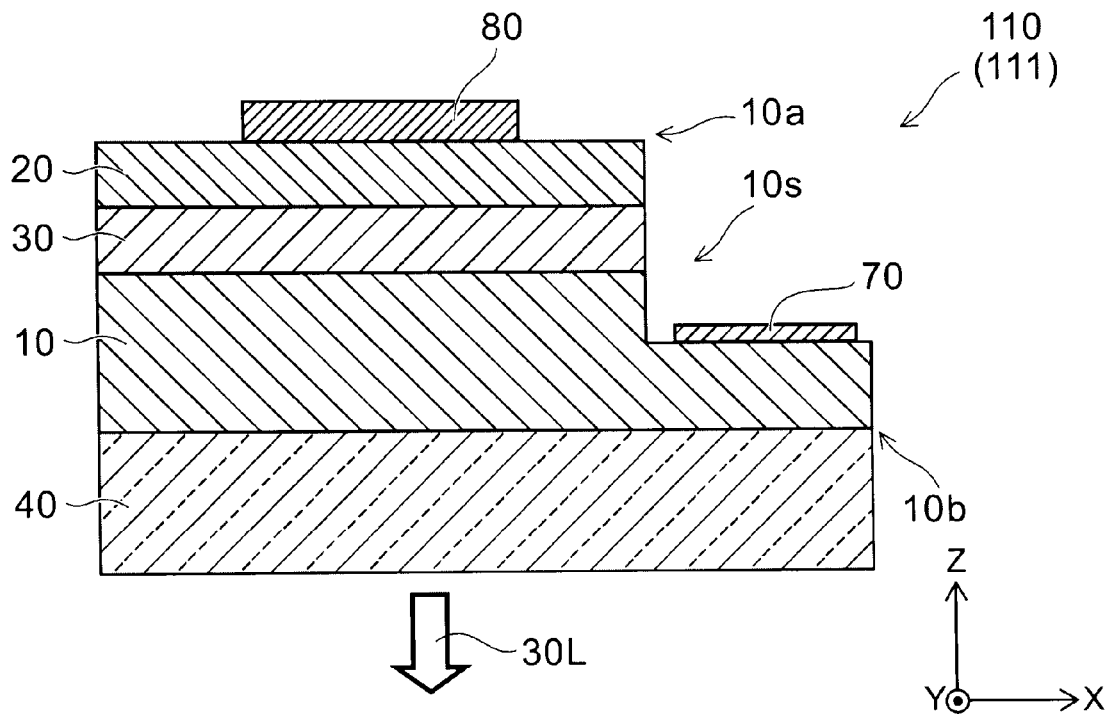
FIG. 1 is a schematic cross-sectional view showing an a semiconductor light emitting device according to a first embodiment.

In general, according to one embodiment, a semiconductor light emitting device includes a light emitting layer, a light transmitting layer and a first semiconductor layer. The light transmitting layer is transmittable with respect to light emitted from the light emitting layer. The first semiconductor layer contacts the light transmitting layer between the light emitting layer and the light transmitting layer. The first semiconductor layer has a thermal expansion coefficient larger than a thermal expansion coefficient of the light transmitting layer, has a lattice constant smaller than a lattice constant of the active layer, and has a tensile stress in an in-plane direction.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating the configuration of a semiconductor light emitting device according to a first embodiment.

As shown in FIG. 1, a semiconductor light emitting device 110 according to the embodiment includes a light emitting layer 30, a light transmitting layer 40 and a first semiconductor layer 10 (a semiconductor layer).

The light emitting layer 30 includes an active layer. The active layer is, for example, a well layer. An example configuration of the light emitting layer 30 will be described later.

The light transmitting layer 40 is transmittable with respect to light emitted from the light emitting layer 30.

The first semiconductor layer 10 contacts the light transmitting layer 40 between the light emitting layer 30 and the light transmitting layer 40.

The semiconductor light emitting device 110 further includes a second semiconductor layer 20. The light emitting layer 30 is disposed between the first semiconductor layer 10 and the second semiconductor layer 20.

The first semiconductor layer 10 has a first conductivity type. The second semiconductor layer 20 has a second conductivity type. Namely, the second semiconductor layer 20 has a conductivity type different from that of the first semiconductor layer 10. In the following, explanations will be given in the case where the first conductivity type is an n-type, and the second conductivity type is a p-type. However, the embodiment is not limited to this, and the embodiment is practicable also in the case where the first conductivity type and the second conductivity type are mutually exchangeable.

As described above, in the semiconductor light emitting device 110, a stacked structure (a stacked structure body 10s) including the first semiconductor layer 10, the second semiconductor layer 20 and the light emitting layer 30 is provided. The stacked structure body 10s has a first major surface 10a and a second major surface 10b. The second major surface 10b is a surface on the opposite side of the first major surface 10a. The second semiconductor layer 20 is disposed between the first major surface 10a and the light emitting layer 30. The first semiconductor layer 10 is disposed between the second major surface 10b and the light emitting layer 30. The stacked structure includes the light transmitting layer 40 on the side of the second major surface 10b. As will be described later, the light transmitting layer 40 may also have a function as a light extraction layer (light extraction window) or a protection layer.

The semiconductor light emitting device 110 further includes a first electrode 70 electrically connected to the first semiconductor layer 10 and a second electrode 80 electrically connected to the second semiconductor layer 20. In the specific example, a part of the first semiconductor layer 10 on the side of the first major surface 10a is exposed. The first electrode 70 is provided in contacting the exposed first semiconductor layer 10. Metal is used for at least one of the first electrode 70 and the second electrode 80. Additionally, a transparent conductive material is used for at least one of the first electrode 70 and the second electrode 80. For the transparent conductive material, for example, a metal oxide such as ITO (Indium Tin Oxide) may be used.

In the semiconductor light emitting device 110, with an applied voltage across the first electrode 70 and the second electrode 80, light is emitted from the light emitting layer 30. As shown in FIG. 1, in the case of the semiconductor light emitting device 110, light emitted from the light emitting layer 30 passes through the light transmitting layer 40 and is output to the outside of the semiconductor light emitting device 110. Namely, an emitted light 30L from the semiconductor light emitting device 110 is output from the side of the second major surface 10b. The light transmitting layer 40 serves as a light extraction portion of the semiconductor light emitting device 110.

Here, a direction going from the first semiconductor layer 10 toward the light emitting layer 30 is assumed to be a Z-axis direction (first direction). One direction perpendicular to this Z-axis direction is assumed to be an X-axis direction. A direction perpendicular to both the Z-axis direction and the X-axis direction is assumed to be a Y-axis direction.

In the following, an example configuration of the light emitting layer 30 will be described.

Figure 2:
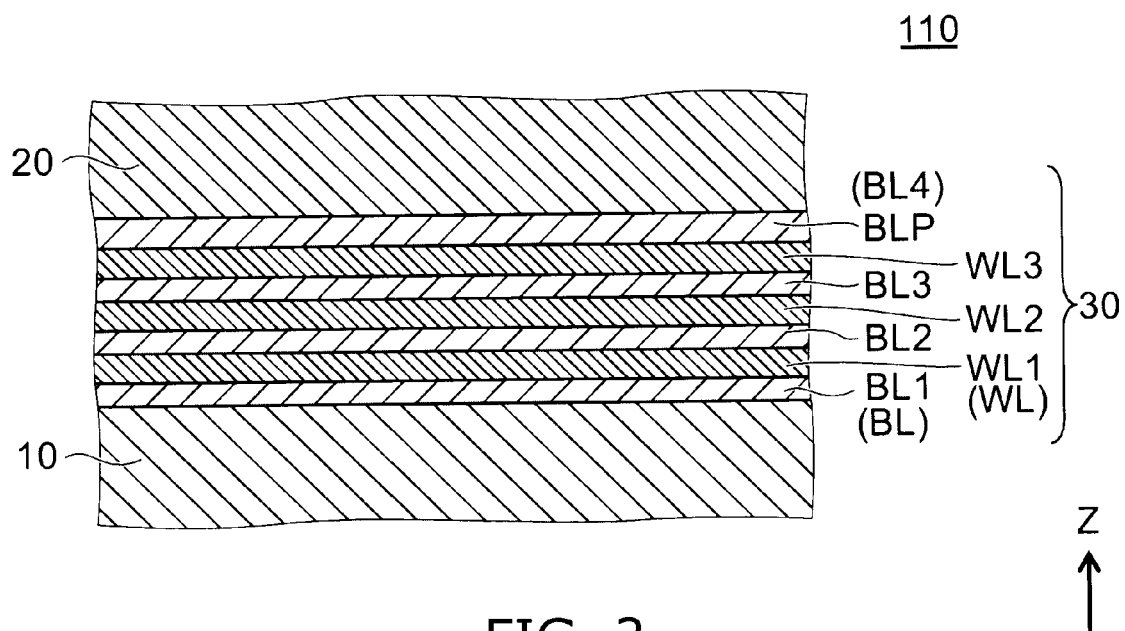
FIG. 2 is a schematic cross-sectional view showing a part of the semiconductor light emitting device according to the first embodiment.

FIG. 2 is a schematic cross-sectional view illustrating a part of the configuration of the semiconductor light emitting device according to the first embodiment.

As shown in FIG. 2, the light emitting layer 30 includes a plurality of barrier layers BL and a plurality of active layers WL, each of which is provided between the barrier layers BL.

In this example, a plurality of well layers WL are provided. Specifically, the number of the active layers WL is three. However, the embodiment is not limited thereto, and the number of the active layers WL is arbitrary. In the specific example, the light emitting layer 30 has a multiple quantum well (MQW) structure.

The plurality of active layers WL include a first active layer WL1 to an n-th active layer WLn. Here, "n" is an integer of two or larger. For example, an (i+1)-th active layer WL(i+1) is provided between the i-th active layer and the second semiconductor layer 20. Here, "i" is an integer of one or larger.

The plurality of barrier layers BL include a first barrier layer BL1 to an n-th barrier layer BLn. For example, an (i+1)-th barrier layer BL(i+1) is provided between an i-th barrier layer BLi and the second semiconductor layer 20.

An i-th active layer WLi is assumed to be provided between the i-th barrier layer BLi and an (i+1)-th barrier layer BL(i+1). Further, the plurality of barrier layers BL include an (n+1)-th barrier layer BL(n+1). The (n+1)-th barrier layer BL(n+1) is, for example, a p-side barrier layer BLP.

As described above, the light emitting layer 30 includes a plurality of active layers WL. These active layers WL are stacked in the Z-axis direction going from the first semiconductor layer 10 toward the light emitting layer 30. The light emitting layer 30 further includes the plurality of barrier layers BL. The plurality of barrier layers BL have a larger bandgap energy larger than the plurality of active layers WL. Each of the plurality of active layers WL is provided between each of the plurality of barrier layers BL.

In the specification, "stacked layers" include the case that the layers are stacked with inserting other element(s) between them, other than the case where layers are stacked in contact with each other.

Figure 3:
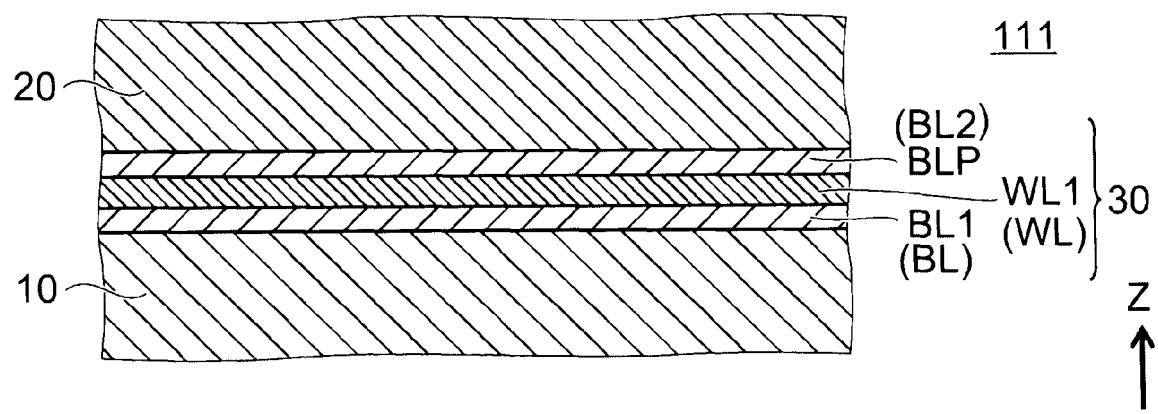
FIG. 3 is a schematic cross-sectional view showing a part of another semiconductor light emitting device according to the first embodiment.

FIG. 3 is a schematic cross-sectional view illustrating a part of the configuration of another semiconductor light emitting device according to the first embodiment.

FIG. 3 illustrates the configuration of the light emitting layer 30 in another semiconductor light emitting device 111 according to the embodiment. Other than the light emitting layer 30, the semiconductor light emitting device 111 has a similar configuration to the semiconductor light emitting device 110, and therefore explanations thereof shall be appropriately omitted.

As shown in FIG. 3, in the semiconductor light emitting device 111, the light emitting layer 30 includes two barrier layers BL and one active layer WL. In this manner, the light emitting layer 30 of the semiconductor light emitting device 111 may have a single quantum well (SQW) structure.

As described above, the light emitting layer 30 further includes the plurality of barrier layers BL other than the active layer WL. The plurality of barrier layers BL have a larger bandgap energy larger than the active layer WL. The active layer WL is provided between the barrier layers BL.

In the embodiment, the MQW structure or the SQW structure is adopted.

In the following, explanations will be given with respect to the semiconductor light emitting device 110 having the MQW structure. However, the following explanations are applied also to the semiconductor light emitting device 111 having the SQW structure.

A nitride semiconductor is used for the first semiconductor layer 10, the second semiconductor layer 20 and the light emitting layer 30. That is, the first semiconductor layer 10, the second semiconductor layer 20 and the light emitting layer 30 respectively include a nitride semiconductor.

The active layer WL may include InGaN, and the barrier layer BL may include GaN. For example, the InGaN layer having In composition ratio of 15% is used for the active layer WL. Herewith, a bandgap energy of the barrier layer BL is larger than that of the active layer WL.

The barrier layer BL may not be doped with In. That is, the barrier layer BL does not substantially contain In. The In composition ratio in the group III elements of the active layer WL is higher than that in the group III elements of the barrier layer BL. Namely, also in the case where the barrier layer BL contains In, the In composition ratio in the barrier layer BL is lower than that in the active layer WL.

The thickness of the active layer WL is, for example, 3 nm. The thickness of the barrier layer BL is, for example, 10 nm.

In the semiconductor light emitting device 110 according to the embodiment, the first semiconductor layer 10 has a larger thermal expansion coefficient than the light transmitting layer 40. Furthermore, the first semiconductor layer 10 has a smaller lattice constant than the active layer WL. Additionally, the first semiconductor layer 10 has a tensile stress in an in-plane direction.

This provides the semiconductor light emitting device having high light emission efficiency and high light extraction efficiency.

For example, the first semiconductor layer 10 is the GaN layer. The thermal expansion coefficient of GaN is about $5.5 \times 10^{-6} \text{K}^{-1}$. In this case, a material having a smaller thermal expansion coefficient than about $5.5 \times 10^{-6} \text{K}^{-1}$ is used for the light transmitting layer 40.

The light transmitting layer 40 includes, for example, silicon oxide. More specifically, the light transmitting layer 40 includes silicon dioxide. For example, the light transmitting layer 40 may includes silicon dioxide as a major component. However, the embodiment is not limited thereto, and an optional element may be added to the light transmitting layer 40, to control, for example, an index of refraction, a thermal expansion coefficient, or the like. For example, an element of at least one of Al, Zr or Ti may be added.

The thermal expansion coefficient of silicon dioxide is, for example, about $0.5 \times 10^{-6} K^{-1}$. Therefore, in the case where the GaN layer is used for the first semiconductor layer 10, and silicon dioxide is used for the light transmitting layer 40, the thermal expansion coefficient of the first semiconductor layer 10 is larger than that of the light transmitting layer 40.

For the light transmitting layer 40, for example, a silicon oxide film with a thickness of 500 nm is used.

Furthermore, the wavelength of the light emitted from the light emitting layer 30 (for example, a peak wavelength) is, for example, in a range of not shorter than 410 nanometers (nm) and not longer than 550 nm. When the light transmitting layer 40 includes silicon oxide, the light transmitting layer 40 is transmittable with respect to light having a wavelength in the above range.

As already described, the active layer WL includes InGaN. In the case where an InGaN layer is used for the active layer WL, and the GaN layer is used for the first semiconductor layer 10, the lattice constant of the first semiconductor layer 10 is smaller than that of the active layer WL.

As described above, in the case where crystalline layers having different lattice constants are stacked, in order to match the respective lattices of these layers, either the compressive stress is applied to the crystalline layer having a large lattice constant, or the tensile stress is applied to the crystalline layer having smaller lattice constant. In this case, if the compressive stress is applied to the crystalline layer having a small lattice constant due to some external factor, a still larger compressive stress would be applied to the crystalline layer having the large lattice constant. As a result, an appropriate stress balance would no longer be obtained.

On the other hand, when the tensile stress is applied to the crystalline layer having the small lattice constant due to some external factor, a part of compressive stress applied to the crystal having the large lattice constant is relaxed. As a result, a more appropriate stress balance is achieved.

As described later, the first semiconductor layer 10 is formed on the light transmitting layer 40. In this process (or in a post process after forming, or the like), a stacked body of the first semiconductor layer 10 and the light transmitting layer 40 is processed at high temperature. In the embodiment, the thermal expansion coefficient of the first semiconductor layer 10 is larger than that of the light transmitting layer 40. When temperature is decreased to low temperature (for example, room temperature) after the thermal process at high temperature, the tensile stress is applied to the first semiconductor layer 10 in an in-plane direction.

The tensile stress in the in-plane direction has components in the direction that intersects the Z-axis direction going from the first semiconductor layer 10 toward the light transmitting layer 30. This tensile stress in the in-plane has in-plane (in the X-Y plane) components in a direction perpendicular to the Z-axis direction. More specifically, the tensile stress in this in-plane direction is the stress in the X-Y plane. This tensile stress in the in-plane direction is, for example, a stress in a direction parallel to the (0001) plane of the first semiconductor layer 10.

When the first semiconductor layer 10 has the tensile stress in the in-plane direction, the first semiconductor layer 10 has a compressive stress in a thickness direction. That is, the first semiconductor layer 10 has the compressive stress in the Z-axis direction.

In the semiconductor light emitting device 110, it is possible to suppress the compressive stress to be applied to the light emitting layer 30 caused by the thermal shrinkage after the thermal process. That is, when the first semiconductor layer 10 having the tensile stress is combined with the active layer WL having the larger lattice constant than the first semiconductor layer 10, an appropriate stress balance can be realized. This can provide high light emission characteristics.

Furthermore, the light transmitting layer 40 which serves as a base for applying the tensile stress to the first semiconductor layer 10 is transmittable with respect to light emitted from the light emitting layer 30. This can provide high light extraction efficiency.

As described above, according to the semiconductor light emitting device 110, a semiconductor light emitting device of high light emission efficiency and high light extraction efficiency is provided.

In the embodiment, it is preferable that the light transmitting layer 40 is amorphous (for example, silicon oxide or the like). In the case where the light transmitting layer 40 is a crystalline layer, the stress relaxation with the introduction of dislocations and defects may happen on the first semiconductor layer 10 according to the stress induced by a lattice mismatch between the light transmitting layer 40 and the first semiconductor layer 10. In contrast, in the case where the light transmitting layer 40 is amorphous, the stress relaxation which accompanies with the introduction of dislocations and defects does not happen because a lattice mismatch between the light transmitting layer 40 and the first semiconductor layer 10 does not exist. Therefore, it is possible to realize an appropriate distortion balance with ease.

In the following, an example manufacturing procedure of the semiconductor light emitting device 110 will be described.

Figure 4A:
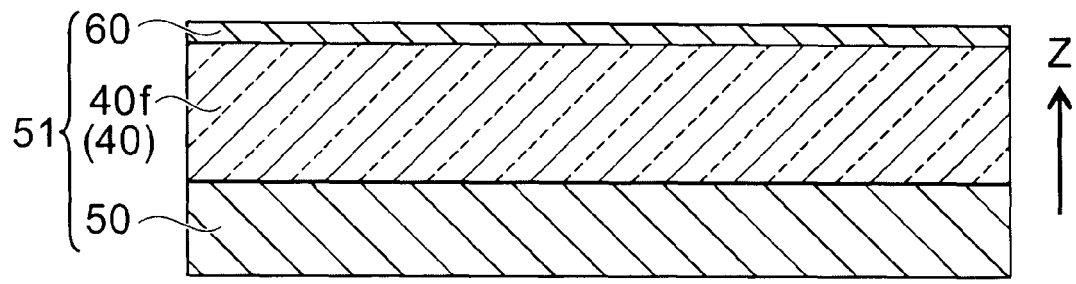
FIGS. 4A to 4C are schematic cross-sectional views showing processes in order of the manufacturing method of the semiconductor light emitting device according to the first embodiment.
Figure 4B:
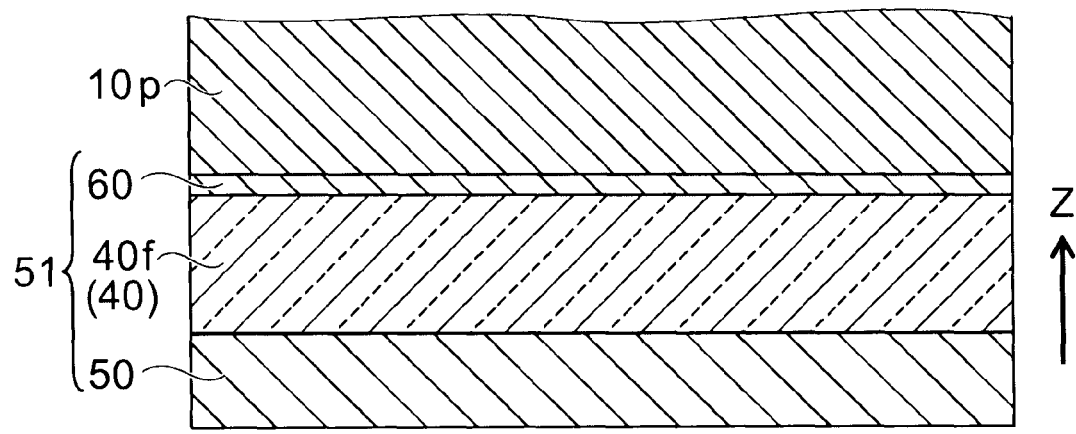
Figure 4C:
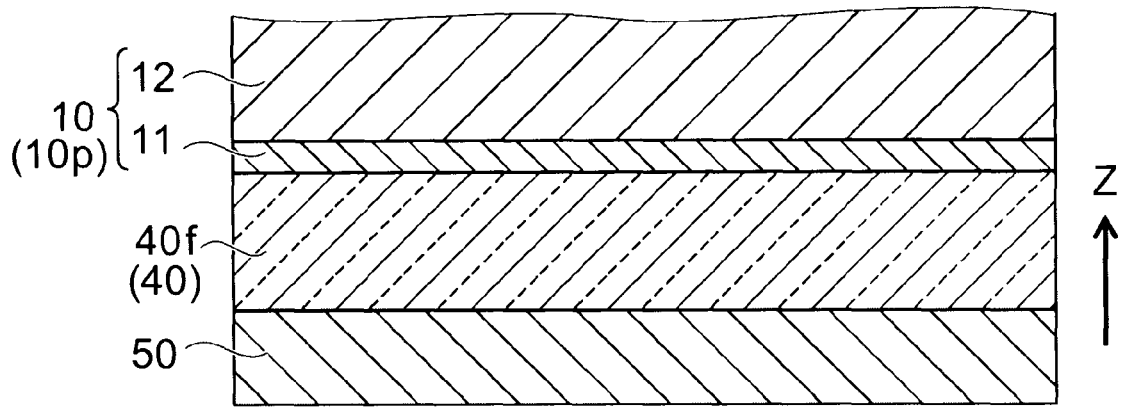

FIG. 4A to FIG. 4C are schematic cross-sectional views illustrating processes in order of the manufacturing method of the semiconductor light emitting device according to the first embodiment.

As shown in FIG. 4A, in the manufacturing method, a substrate 51 having an SOI (Silicon on Insulator) structure is used. In the specific example, the substrate 51 includes a base 50, a silicon layer 60 and an insulating layer 40f. The insulating layer 40f is provided between the base 50 and the silicon layer 60. The insulating layer 40f serves as the light transmitting layer 40. However, the embodiment is not limited thereto. For example, the base 50 may be omitted, and the substrate 51 may include the insulating layer 40f and the silicon layer 60 formed on the insulating layer 40f.

For the base 50, for example, a silicon crystalline substrate is used. In the specific example, a crystal orientation of crystals of the base 50 is a (111) surface. However, the embodiment is not limited thereto. For example, a polycrystalline layer may be used for the base 50. Moreover, when the base 50 is a crystalline layer, the crystal orientation of the crystalline layer is arbitrary. The thickness of the base 50 is, for example, 650 micrometers (μm). However, the thickness of the base 50 is arbitrary in the embodiment.

For the insulating layer 40f, for example, $SiO_2$ is used. The thickness of the insulating layer 40f is, for example, 200 nm.

The thickness of the silicon layer 60 is, for example, in a range of not less than 2 nm and not more than 20 nm. More specifically, the thickness of the silicon layer 60 is, for example, about 10 nm. The crystal orientation of crystal in the silicon layer 60 is, for example, a (111) surface.

In the case where the thickness of the silicon layer 60 of the substrate 51 is larger than the desired thickness, it is possible to obtain the desired thickness (for example, 10 nm) of the silicon layer 60, for example, by performing the thermal-oxidization of the surface portion of the silicon layer 60 to make the silicon crystalline portion of the silicon layer 60 thinner, and removing the thermal-oxidized layer. The thermal-oxidized layer can be removed, for example, by hydrofluoric acid treatment.

For example, a process with dilute hydrofluoric acid is applied to the substrate 51. This process can give a hydrogen-terminated surface structure onto the surface of the silicon layer 60. Herewith, the surface of the silicon layer 60 becomes a water repellent surface. For the dilute hydrofluoric acid, for example, a dilute hydrofluoric acid solution with the concentration of approximately 1% can be used. The process may be performed, for example, for about one minute.

By performing the process with hydrofluoric acid for removing the thermal-oxidized layer of the surface portion of the silicon layer 60, the above process with the dilute hydrofluoric acid for applying the hydrogen-terminated surface structure can be omitted.

As shown in FIG. 4B, a semiconductor crystal 10p to be formed into the first semiconductor layer 10 is formed on the silicon layer 60. This semiconductor crystal 10p is formed by a thin film crystal growth (epitaxial growth) method. In the specific example, this semiconductor crystal 10p is the GaN layer.

When forming this GaN layer, for example, the following is performed.

The substrate 51 is set, for example, in an MOCVD (Metalorganic Chemical Vapor Deposition) apparatus, and the temperature of the substrate 51 is increased, for example, to 500° C. At this temperature, a first GaN layer is formed using TMG (trimethylgallium) and $NH_3$ (ammonia) as sources. The thickness of the first GaN layer is, for example, 20 nm.

The temperature of the substrate 51 is increased, for example, to 1080° C. At this temperature, a second GaN layer is formed using TMG and $NH_3$ as sources. The thickness of the second GaN layer is, for example, 2 μm. The first GaN layer and the second GaN layer correspond to the semiconductor crystal 10p to be formed into the first semiconductor layer 10.

During the above temperature increasing process (in the above example, the temperature is increased from 500° C. to 1080° C.) and the forming process of the second GaN layer at high temperature (in the above example, 1080° C.), the silicon layer 60 becomes thinner. That is, silicon atoms included in the silicon layer 60 are incorporated into the semiconductor crystal 10p. Since the silicon layer 60 is thin, substantially all the silicon atoms included in the silicon layer 60 are incorporated into the semiconducting crystal 10p.

Consequently, as shown in FIG. 4C, the silicon layer 60 disappears. Thereby, the first semiconductor layer 10 is formed. This first semiconductor layer 10 includes silicon. The insulating layer 40f is the light transmitting layer 40.

The light emitting layer 30 is formed on the first semiconductor layer 10. Further, the second semiconductor layer 20 is formed on the light emitting layer 30. This forms the stacked structure including the first semiconductor layer 10, the light emitting layer 30 and the second semiconductor layer 20.

The stacked structure body 10s is taken out of the processing apparatus and the following device process is performed.

For example, the stacked structure body 10s and the base 50 are separated, and the base 50 is removed. More specifically, for example, a protection film is formed on the surface of the second semiconductor layer 20. The base 50 is removed by grinding or chemical etching. The protection film is removed.

Furthermore, for example, a part of the second semiconductor layer 20, a part of the light emitting layer 30 and a part of the semiconductor layer 10 are removed to expose a part of the first semiconductor layer 10. The first electrode 70 is formed on the exposed first semiconductor layer 10. The second electrode 80 is formed on the second semiconductor layer 20.

Herewith, the semiconductor light emitting device 110 is fabricated. The removing of the base 50 may be performed in an arbitrary technically available process.

In the semiconductor light emitting device 110 thus fabricated, the tensile stress is applied to the first semiconductor layer 10 in the in-plane direction. The epitaxial growth of the semiconductor layer including the light emitting layer 30 and the second semiconductor layer 20 is grown at high temperature. When the temperature of the substrate 51 is decreased back to the room temperature after finishing this epitaxial growth at high temperature, as the thermal expansion coefficient of an $SiO_2$ layer of the light transmitting layer 40 (the insulating layer 40f) is smaller than that of the first semiconductor layer 10 (the semiconductor crystal 10p), the thermal shrinkage in the light transmitting layer 40 is small. Therefore, the compressive stress (the compressive stress in the in-plane direction) is not applied to the first semiconductor layer 10.

When forming the first electrode 70 and the second electrode 80, a high temperature process is adopted in order to reduce a contact resistance between these electrodes and the semiconductor layer. In the semiconductor light emitting device 110, even after having performed the high temperature process for forming the electrodes, it is possible to suppress the compressive stress (the compressive stress in the in-plane direction) to be applied to the first semiconductor layer 10 caused by repeating the thermal expansion and shrinkage.

Figure 5A:
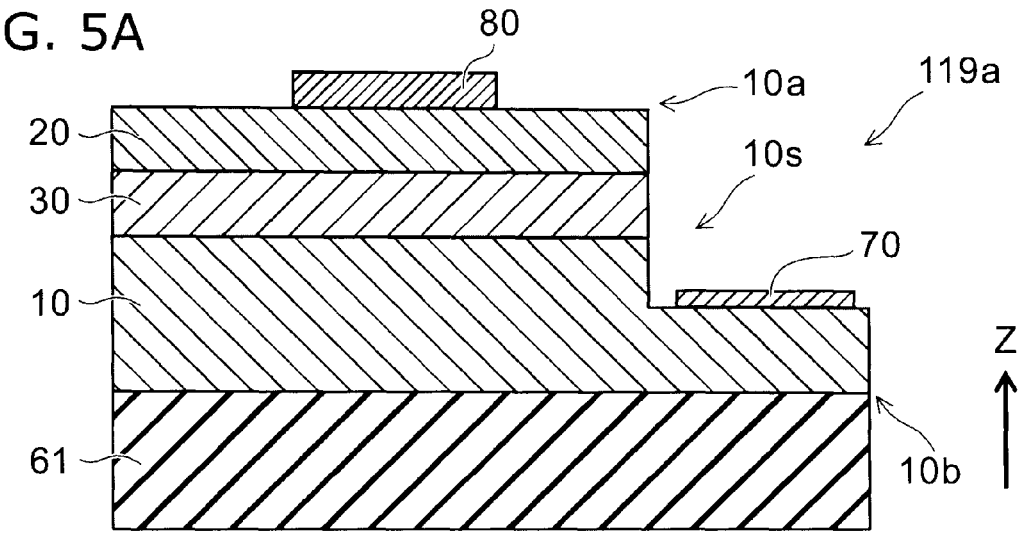
FIGS. 5A to 5C are schematic cross-sectional views showing semiconductor light emitting devices according to reference examples.
Figure 5B:
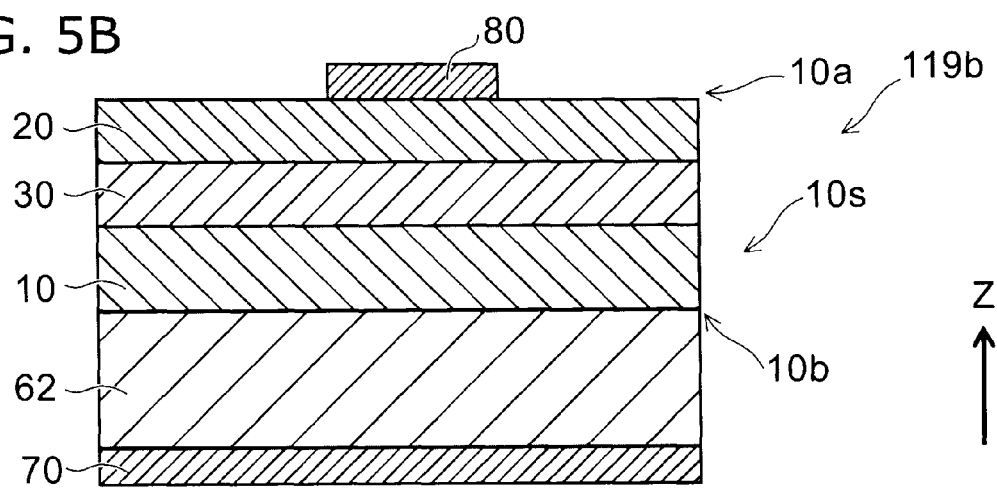
Figure 5C:
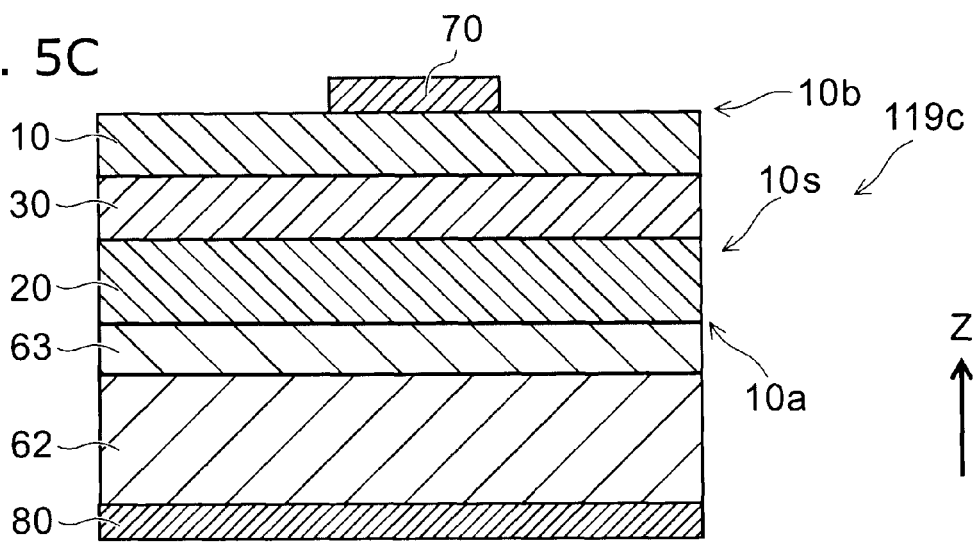

FIG. 5A to FIG. 5C are schematic cross-sectional views illustrating the configuration of semiconductor light emitting devices of reference examples.

As shown in FIG. 5A, in a semiconductor light emitting device 119a of the first reference example, the first semiconductor layer 10 is formed on a sapphire substrate 61. In terms of the epitaxial growth of a GaN crystal on a sapphire substrate, the lattice length of sapphire crystal on which the lattice spacing of GaN crystal is matched is shorter than the intrinsic lattice constant of GaN crystal. Furthermore, the thermal expansion coefficient of sapphire is larger than that of GaN crystal. That is, in the case of the first reference example, the thermal expansion coefficient of the first semiconductor layer 10 is a smaller than that of the under layer substrate 61.

In the first reference example, due to the difference in lattice constant and difference in thermal expansion coefficient, when decreasing the process temperature to a room temperature after forming the stacked structure including the first semiconductor layer 10 of GaN on the sapphire substrate 61 at high temperature, a large compressive stress (the compressive stress in the in-plane direction) is applied to the first semiconductor layer 10.

The light emitting layer 30 including the active layer WL (for example, an InGaN layer) having a larger lattice constant than the first semiconductor layer 10 (for example, a GaN layer) is provided on the first semiconductor layer 10 having the described compressive stress in the in-plane direction. Therefore, in this configuration, the stress would not be controlled appropriately in the semiconductor crystalline layer including the first semiconductor layer 10 and the light emitting layer 30. For example, an excessive compressive stress is applied to the active layer WL. Therefore, the crystalline quality in the light emitting layer 30 is degraded. This results in a decrease in the light emission efficiency.

There is a configured such that a lattice adjustment layer is provided between the sapphire substrate 61 and the first semiconductor layer 10. That is, an attempt is made to adjust the compressive stress in the in-plane direction to be applied to the first semiconductor layer 10 by the lattice adjustment layer, so that the compressive stress to be applied to the active layer WL is relaxed. However, there is a limit in controlling the stress in the semiconductor crystalline layer by the lattice adjustment layer. Therefore, there is a limit in improving the light emission efficiency even in the structure using the lattice adjustment layer.

There is a configured such that, for example, after forming the stacked structure including the first semiconductor layer 10 on the sapphire substrate 61, the substrate 61 is removed. Further, there is a configured such that after removing the substrate 61, the $SiO_2$ layer (for example, the protection layer) is provided in the first semiconductor layer 10. The compressive stress in the in-plane direction remains in the first semiconductor layer 10 even after the removing the sapphire substrate 61. Therefore, even in the structure wherein the substrate 61 is removed and the $SiO_2$ layer is provided in the first semiconductor layer 10, the compressive stress in the in-plane direction remains in the first semiconductor layer 10. In the configuration wherein the first semiconductor layer 10 is formed on the sapphire substrate 61, it is difficult to control appropriately the stress. That is, in the first reference example and in its extension, light emission efficiency is low.

As shown in FIG. 5B, in a semiconductor light emitting device 119b of the second reference example, the first semiconductor layer 10 is formed on a silicon crystalline substrate 62. When the GaN crystal is epitaxially grown on the silicon (111) surface, the corresponding lattice length of silicon is longer than the lattice constant of an a-axis of GaN. Additionally, the thermal expansion coefficient of a silicon crystal is smaller than that of a GaN crystal. Therefore, the tensile stress in the in-plane direction remains in the first semiconductor layer 10 on the substrate 62 of the silicon crystal. Therefore, in the configuration of the second reference example, there is possibility to control appropriately the stress applied to the active layer WL.

However, in the case of the second reference example, the silicon crystal used in the substrate 62 absorbs the light emitted from light emitting layer 30. That is, the substrate 62 is not transmittable with respect to light emitted from the light emitting layer 30. Therefore, it is difficult to extract the light from the back surface of the substrate. Moreover, when extracting the light from the surface side of the substrate, as the light towards the back surface side is absorbed, it is also difficult to obtain high light extraction efficiency since light towards the back surface side has been absorbed when light is taken out of the substrate surface side.

The semiconductor light emitting device 119b may be configured such that a reflecting layer using a DBR (Distributed Bragg Reflector) is provided between the substrate 62 and the first semiconductor layer 10. However, in this configuration, it is difficult to realize both desirable reflection characteristics and an appropriate thermal expansion coefficient with respect to the first semiconductor layer 10. It is therefore difficult to obtain high light emission efficiency and high light extraction efficiency simultaneously.

As shown in FIG. 5C, in a semiconductor light emitting device 119c of a third reference example, a metal layer 63 is provided on the surface (lower surface) of the second semiconductor layer 20, a silicon plate 62 is provided on the lower surface of the metal layer 63, and the second electrode 80 is provided on the lower surface of the silicon plate 62. In this configuration, the silicon plate 62 having the metal layer and the second electrode 80 is bonded on the surface of second semiconductor layer 20 after forming the first semiconductor layer 10, the light emitting layer 30 and the second semiconductor layer 20 on the substrate, which is not shown. The substrate is removed, and the first electrode 70 is provided on the first semiconductor layer 10. In this configuration, the light emitted from the light emitting layer 30 is reflected from the metal layer 63, and is emitted from the side of the second major surface 10b. In general, the thermal expansion coefficient of the metal layer 63 is larger than that of GaN in the second semiconductor layer 20. Therefore, the metal layer 63 shrinks significantly after performing the thermal process for forming the metal layer 63 on the second semiconductor layer 20. Consequently, the compressive stress is applied to the second semiconductor layer 20 in the in-plane direction. Therefore, also in the third reference example, it is difficult to obtain high light emission efficiency and high light extraction efficiency simultaneously.

In contrast, in the semiconductor light emitting device 110 according to the embodiment, it is possible to suppress the compressive stress to be applied to the first semiconductor layer 10 caused by the thermal shrinkage after the thermal process. That is, an appropriate stress balance is realized. As a result, high light emission characteristics can be realized. Furthermore, by using the light transmitting layer 40 as a substrate which serves as a base for applying the tensile stress to the first semiconductor layer 10, it is possible to obtain high light extraction efficiency. Therefore, according to the semiconductor light emitting device 110, a semiconductor light emitting device of high light emission efficiency and high light extraction efficiency can be provided.

Furthermore, by using the amorphous light transmitting layer 40, the compressive stress due to lattice mismatch between the light transmitting layer 40 and the first semiconductor layer 10 is not generated. Herewith, it becomes easier to realize an appropriate stress balance.

In the embodiment, the tensile stress is applied to the first semiconductor layer 10 in the in-plane direction. Therefore, it is possible to, for example, omit the lattice adjustment layer. Even without the lattice adjustment layer, a desirable active layer WL can be obtained. The light emission efficiency can be improved, and high light emission intensity can be obtained. Thus, in the embodiment, the light emitting layer 30 can be provided in contact with the first semiconductor layer 10.

As described above, in the embodiment, the first semiconductor layer 10 is obtained, for example, by forming the first semiconductor layer 10 (the semiconducting crystal 10p) on the silicon layer 60 on the light transmitting layer 40 (the insulating layer 40f). Then, the silicon layer 60 disappears substantially after the first semiconductor layer 10 is formed. If the silicon layer 60 remains, since the silicon layer would absorb the light emitted from the light emitting layer 30, the light extraction efficiency would be lowered.

For example, in the case where the wavelength (the peak wavelength) of the light emitted from the light emitting layer 30 is 440 nm, an absorption coefficient of light of the silicon layer 60 is $1.26 \times 10^4$ cm$^{-1}$. Therefore, when the thickness of the silicon layer 60 is 10 nm, an absorption of light becomes one percent (%) or higher. In the embodiment, the silicon layer 60 does not exist substantially, and the first semiconductor layer 10 substantially contacts the light transmitting layer 40.

Figure 6:
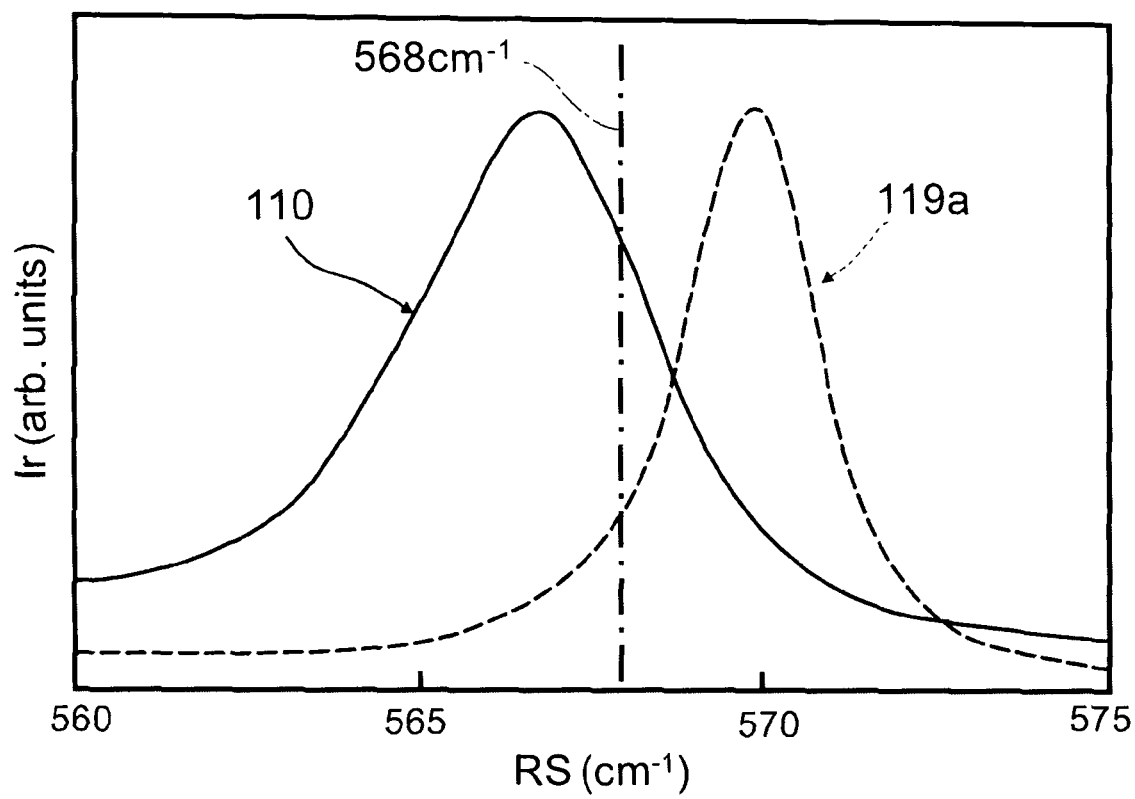
FIG. 6 is a graph illustrating characteristics of the semiconductor light emitting device.

FIG. 6 is a graph illustrating characteristics of the semiconductor light emitting device.

This figure illustrates results of measurement of Raman spectroscopy with respect to the semiconductor light emitting device 110 according to the embodiment and the semiconductor light emitting device 119a of the first reference example. In FIG. 6, the horizontal axis represents Raman shift RS (wavenumber, cm$^{-1}$). The vertical axis represents intensity Ir of Raman scattering (arbitrary scale).

As shown in FIG. 6, in the case of the semiconductor light emitting device 110 according to the embodiment, the Raman shift RS at a peak intensity Ir is 566.5 cm$^{-1}$. In the case of the semiconductor light emitting device 119a of the first reference example, the Raman shift RS at a peak intensity Ir is 570 cm$^{-1}$. The Raman shift RS of GaN when the stress is not applied is 568 cm$^{-1}$. Therefore, it can be seen from the results shown in FIG. 6 that in the semiconductor light emitting device 110, the tensile stress is applied to the GaN layer (the first semiconductor layer 10) in an in-plane direction. Similarly, it can be seen that in the semiconductor light emitting device 119a, the compressive stress is applied to the GaN layer (the first semiconductor layer 10) in the in-plane direction.

As described above, the stress applied to the first semiconductor layer 10 can be measured by the Raman spectroscopy, for example.

Figure 7A:
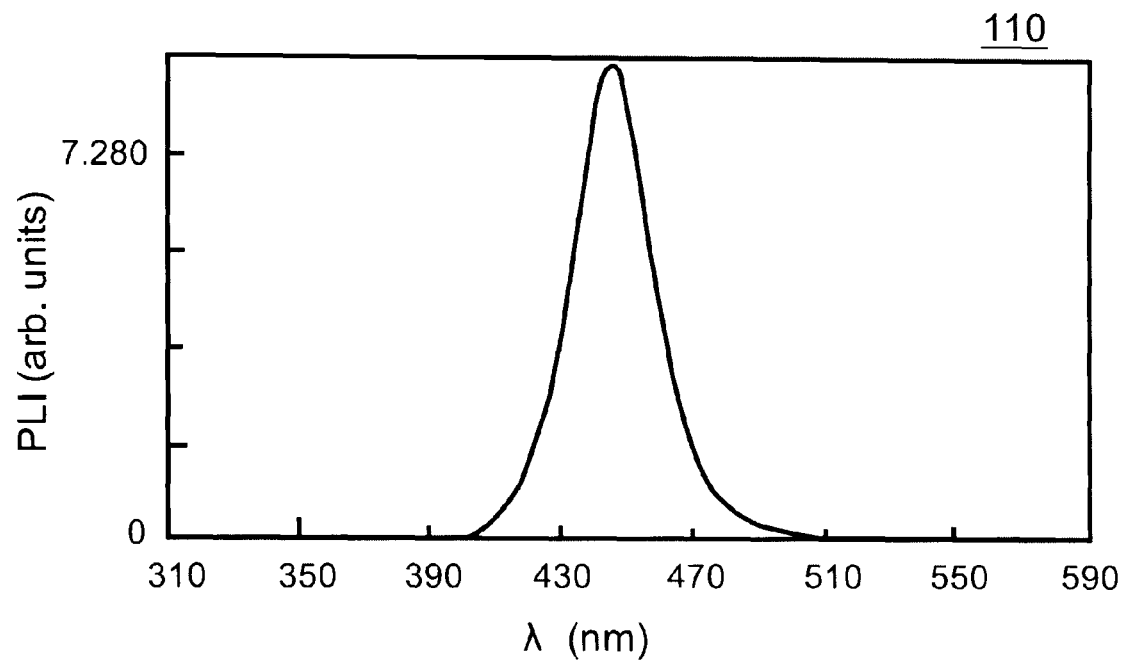
FIGS. 7A and 7B are graphs illustrating characteristics of the semiconductor light emitting devices.
Figure 7B:
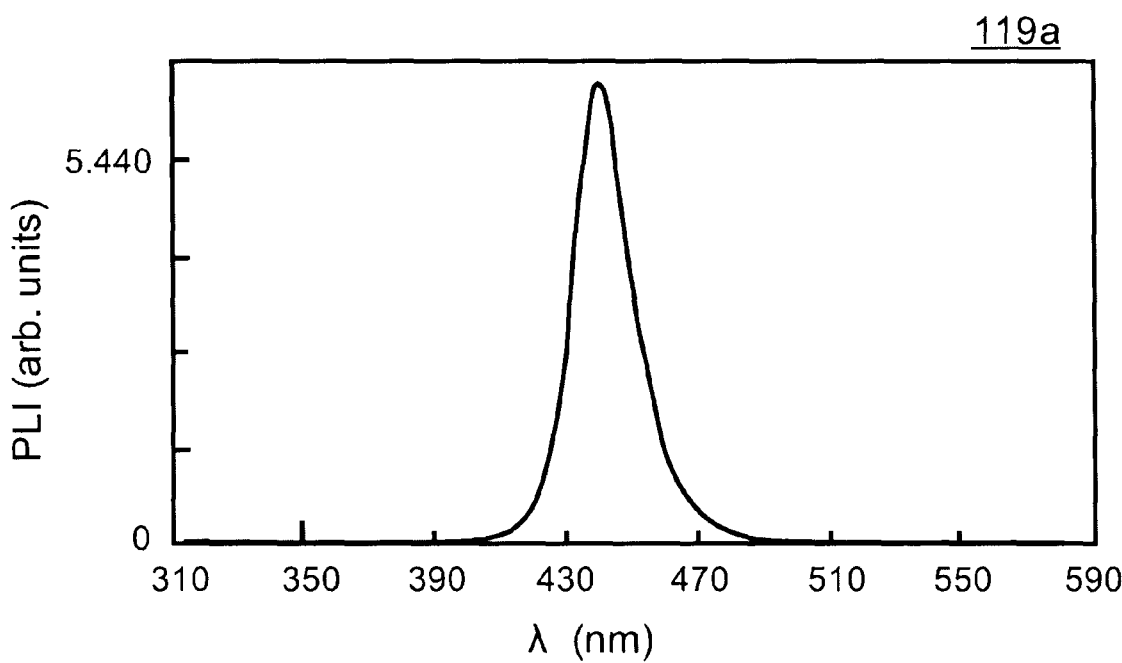

FIG. 7A and FIG. 7B are graphs illustrating characteristics of the semiconductor light emitting devices.

Namely, FIG. 7A and FIG. 7B respectively illustrate results of measurement on the light emission characteristics of the semiconductor light emitting device 110 according to the embodiment and the semiconductor light emitting device 119a of the first reference example. The semiconductor light emitting device 110 and the semiconductor light emitting device 119a have the MQW structure. These light emission characteristics were measured by Photoluminescence (PL) measurement. The horizontal axis represents wavelength λ(nm). The vertical axis represents PL light emission intensity PLI (arbitrary scale).

As shown in FIG. 7A, the peak wavelength in the semiconductor light emitting device 110 is about 440 nm. The light transmitting layer 40 is transmittable with respect to the light having a wavelength of 440 nm.

As shown in FIG. 7B, the peak wavelength in the semiconductor light emitting device 119a is also about 440 nm.

As can be seen from FIG. 7A and FIG. 7B, a maximum value of a PL light emission intensity PLI of the semiconductor light emitting device 110 is larger than a maximum value of a PL light emission intensity PLI of the semiconductor light emitting device 119a.

Figure 8A:
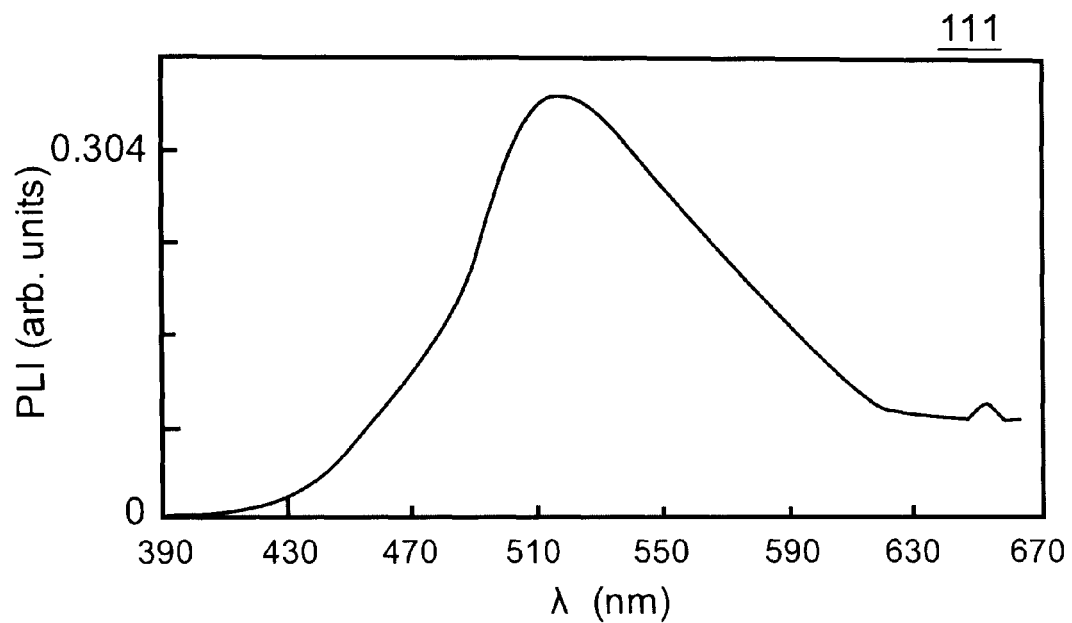
FIGS. 8A and 8B are graphs illustrating characteristics of the semiconductor light emitting devices.
Figure 8B:
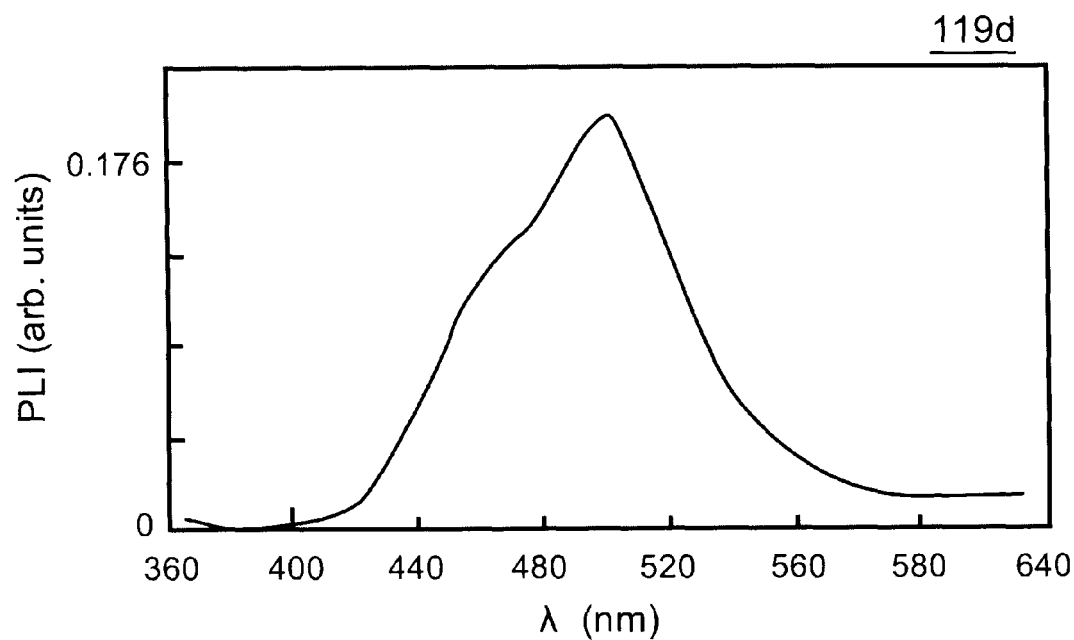

FIG. 8A and FIG. 8B are graphs illustrating characteristics of the semiconductor light emitting devices.

Namely, FIG. 8A and FIG. 8B respectively illustrate results of measurement on the light emission characteristics of the semiconductor light emitting device 111 according to the embodiment and a semiconductor light emitting device 119d of a fourth reference example. The semiconductor light emitting device 111 and the semiconductor light emitting device 119d have the MQW structure. Other than the configuration of the light emitting layer 30, the semiconductor light emitting device 119d has a similar configuration to that of the semiconductor light emitting device 119a shown in FIG. 5A. That is, in the semiconductor light emitting device 119d, the first semiconductor layer 10 is formed on the sapphire substrate 61, and the light emitting layer 30 of the SQW structure is formed on the semiconductor layer 10.

As shown in FIG. 8A, a peak wavelength in the semiconductor light emitting device 111 is about 510 nm. The light transmitting layer 40 is transmittable with respect to light having a wavelength of 510 nm.

As shown in FIG. 8B, the peak wavelength in the semiconductor light emitting device 119d is about 490 nm.

As can be seen from FIG. 8A and FIG. 8B, a maximum value of the PL light emission intensity PLI of the semiconductor light emitting device 111 is larger than a maximum value of the PL light emission intensity PLI of the semiconductor light emitting device 119d.

As described above, according to the embodiment, a high PL light emission intensity is obtained both in the MQW structure and the SQW structure.

The semiconductor light emitting device 111 of the SQW structure has similar Raman spectrum characteristics (Raman shift RS) to those of the semiconductor light emitting device 110 shown in FIG. 6.

In general, the n-type semiconductor layer is obtained by doping the semiconductor layer with an n-type impurity (for example, silicon), and the p-type semiconductor layer is obtained by doping the semiconductor layer with a p-type impurity (for example, magnesium). For example, when forming the GaN layer (for example, forming the GaN layer at 1080° C.) to be formed into the n-type semiconductor layer (for example, corresponding to the first semiconductor layer 10), the n-type semiconductor layer is obtained by doping with silicon atoms in about $10^{18}$ cm$^{-3}$.

As described already referring to FIG. 4C, in the embodiment, the first semiconductor layer 10 is obtained by forming the first semiconductor layer 10 (the semiconductor crystal 10p) on the silicon layer 60 on the light transmitting layer 40 (the insulating layer 40f). In this process, silicon atoms are introduced from the silicon layer 60 into the semiconductor crystal 10p (the first semiconductor layer 10). Therefore, the doping which is normally performed can be omitted.

That is, when forming the first semiconductor layer 10 (the semiconductor crystal 10p) on the silicon layer 60, Ga atoms in the first semiconductor layer 10 react with the silicon layer 60. Silicon atoms are diffused in the first semiconductor layer 10. Therefore, even if the silicon source is not used when forming the first semiconductor layer 10, the silicon atoms are introduced in a portion of the first semiconductor layer 10 on the side of the light transmitting layer 40 (the lower portion of the growth layer).

For example, in the portion (for example, about 500 nm in thickness) of the first semiconductor layer 10 on the side of the light transmitting layer 40, silicon atoms are contained in an amount of approximately not less than $10^{18}$ cm$^{-3}$ and not more than $10^{20}$ cm$^{-3}$.

In the manufacturing of the semiconductor light emitting device 110, for example, silicon atoms are introduced from the silicon layer 60 into the semiconductor crystal 10p (the first semiconductor layer 10). Therefore, it is easy to form a concentration distribution of the silicon atoms in the semiconducting crystal 10p. For example, as shown in FIG. 4C, the first semiconductor layer 10 may include a first portion 11 near the light transmitting layer 40 and a second portion 12 provided between the first portion 11 and the light emitting layer 30. The silicon concentration of the first portion 11 is higher than that of the second portion 12.

In the manufacturing of the semiconductor light emitting device 110, when using the silicon crystalline substrate as the substrate, a large amount of silicon atoms are diffused in the entire region of gallium nitride. This would produce an undesirable state which is close to a mixed crystal of silicon and gallium nitride in the lower portion of the growth layer.

In contrast, in the above manufacturing method, since the silicon layer 60 of a very thin thickness is used, it is easy to control an amount of silicon atoms to be introduced into the first semiconductor layer 10.

The embodiment may include the manufacturing method of the semiconductor light emitting device as explained referring to FIG. 4A to FIG. 4C. This method is a manufacturing method of the semiconductor light emitting device including the light emitting layer 30 having the active layer WL, the light transmitting layer 40f being transmittable with respect to light emitted from the light emitting layer 30, and the first semiconductor layer 10 (the semiconductor layer) contacting the light transmitting layer 40 between the light emitting layer 30 and the light transmitting layer 40, in which the first semiconductor layer 10 has a larger thermal expansion coefficient than the light transmitting layer 40, a smaller lattice constant than the active layer WL and the tensile stress in an in-plane direction.

In this manufacturing method, the first semiconductor layer 10 (for example, the semiconductor crystal 10p) is formed on the silicon layer 60 provided on the light transmitting film (for example, the insulating layer 40f) to be formed into the light transmitting layer 40. The silicon layer 60 is caused to disappear after forming the first semiconductor layer 10.

Thereby, the first semiconductor layer 10 contacts the light transmitting film (the light transmitting layer 40).

In the manufacturing method, it is preferable that the thickness of this silicon layer 60 is less than 2 nm and not more than 20 nm. When the thickness of the silicon layer 60 is thinner than 2 nm, it would be difficult to realize a uniformity of the first semiconductor layer 10. When the thickness of the silicon layer 60 is thicker than 20 nm, it would be difficult to make the silicon layer 60 disappear. Therefore, light is absorbed by the residual Si, and a reduction in light extraction efficiency is easy to occur.

The disappearing of the silicon layer 60 includes the incorporation of silicon atoms in the silicon layer 60 into the first semiconductor layer 10 by increasing the temperature of the silicon layer 60. Herewith, the silicon layer 60 substantially disappears.

Moreover, in the embodiment, the first semiconductor layer 10 includes silicon atoms introduced from the silicon layer 60.

In the semiconductor light emitting device manufactured by the above method, the first semiconductor layer 10 is formed on the silicon layer 60 on the light transmitting film (for example, the insulating layer 40f) to be formed into the light transmitting layer 40. After forming the first semiconductor layer 10, the silicon layer 60 disappears, thereby making the first semiconductor 10 contact the light transmitting film. The disappearing of the silicon layer 60 includes the increasing of the temperature of the silicon layer 60. Furthermore, in the semiconductor light emitting device manufactured by the above method, the first semiconductor layer 10 includes silicon atoms introduced from the silicon layer 60.

In the manufacturing method described referring to FIG. 4A to FIG. 4C, descriptions have been given through the case of the vapor growth technique by an organic metal (Metal-Organic Chemical Vapor Deposition (MOCVD)) as the method of forming semiconductor layers (crystal growth method). However, the embodiment is not limited thereto. For example, molecular beam epitaxy (MBE) and HVPE (Hydride Vapor Phase Epitaxy) or other arbitrary method may be adopted.

Second Embodiment

Figure 9:
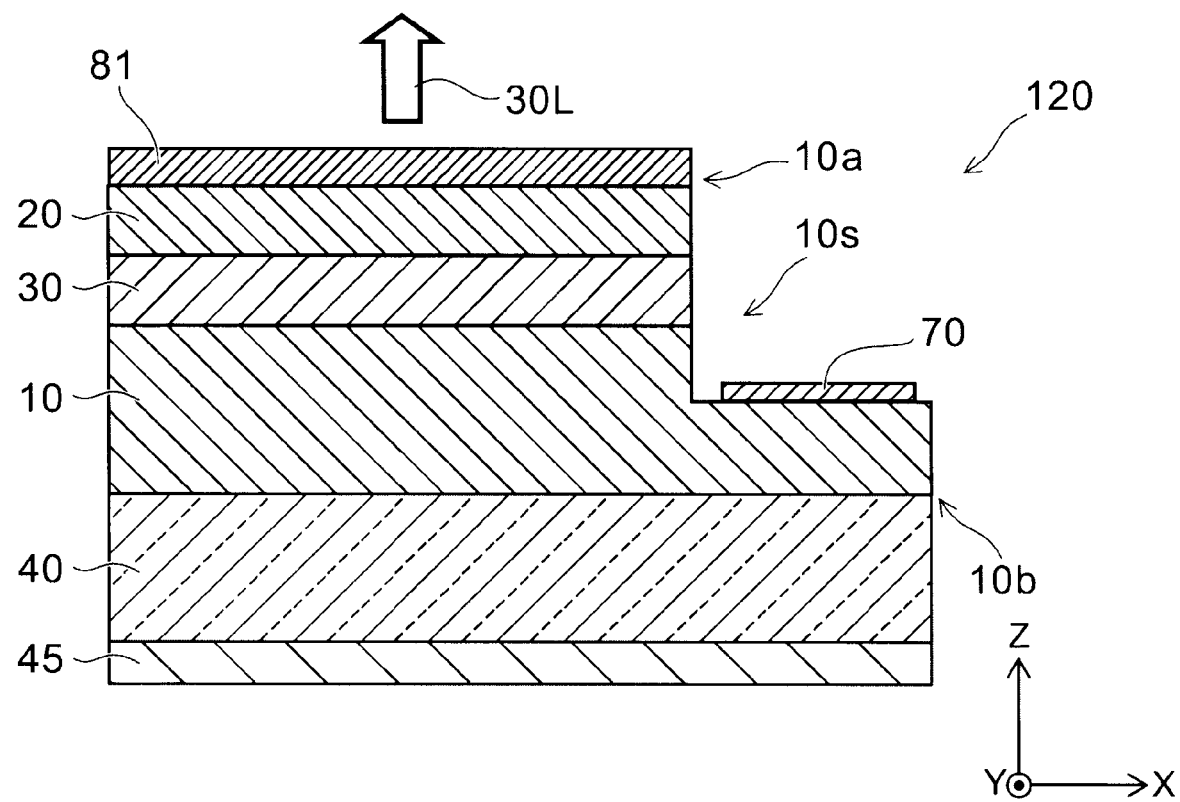
FIG. 9 is a schematic cross-sectional view illustrating a semiconductor light emitting device according to a second embodiment.

FIG. 9 is a schematic cross-sectional view illustrating the configuration of a semiconductor light emitting device according to a second embodiment.

As shown in FIG. 9, a semiconductor light emitting device 120 according to the embodiment further includes a reflecting layer 45 in addition to the light emitting layer 30, the light transmitting layer 40 and the first semiconductor layer 10. In this case also, the second semiconductor layer 20, the first electrode 70 and a second electrode 81 are provided. The light emitting layer 30, the light transmitting layer 40 and the first semiconductor layer 10 of the semiconductor light emitting device 120 have similar configurations to those of the semiconductor light emitting device 110, and therefore the descriptions thereof is omitted.

The reflecting layer 45 reflects the light emitted from the light emitting layer 30. The light transmitting layer 40 is disposed between the first semiconductor layer 10 and the reflecting layer 45. For example, metal is used for the reflecting layer 45.

The second electrode 81 is transmittable with respect to the light emitted from the light emitting layer 30.

As shown in FIG. 9, in the semiconductor light emitting device 120, the light emitted from the light emitting layer 30 is output to the outside of the semiconductor light emitting device 120 in a direction going from the first semiconductor layer 10 toward the tight emitting layer 30. That is, an emitted light 30L from the semiconductor light emitting device 120 is output from the side of the first major surface 10a. The emitted light 30L passes through the second electrode 81 and is output to the outside of the semiconductor light emitting device 120. In the semiconductor light emitting device 120, at least a part of the light emitted from the light emitting layer 30 passes through the light transmitting layer 40 and is reflected from the reflecting layer 45, and is then output to the outside of semiconductor light emitting device 120.

The semiconductor light emitting device 120 is formed, for example, by forming the reflecting layer 45 on the surface of the light transmitting layer 40 on the opposite side of the stacked structure body 10s, after forming the stacked structure on the light transmitting layer 40.

For example, in a reference example in which the reflecting layer 45 (for example, a metal film) is stacked directly on the first semiconductor layer 10 by the thermal process, the compressive stress is applied to the first semiconductor layer 10 due to a difference in thermal expansion coefficient when decreasing temperatures. Therefore, the light emission efficiency is low.

In contrast, in the semiconductor light emitting device 120 according to the embodiment, the light transmitting layer 40 of $SiO_2$ or the like is provided between the reflecting layer 45 and the first semiconductor layer 10. By using the light transmitting layer 40 having a smaller thermal expansion coefficient than that of the first semiconductor layer 10 as a layer contacting the first semiconductor layer 10, it is possible to suppress the compressive stress to be applied to the first semiconductor layer 10. In the semiconductor light emitting device 120, it is also possible to obtain a semiconductor light emitting device of high light emission efficiency and high light extraction efficiency.

As described above, according to the embodiment, a total stress balance can be controlled appropriately. That is, by the appropriate selection of a material for a layer (the light transmitting layer 40), which is used for, at least, either of the protection layer of the semiconductor layer or the light extraction layer, the structure having an appropriate stress balance can be provided.

According to the embodiment, a semiconductor light emitting device of high light emission efficiency and high light extraction efficiency can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements incorporated unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in semiconductor light emitting devices such as semiconductor layers, light-emitting layers, active layers, barrier layers, light transmitting layers, reflecting layers, and electrodes included in semiconductor light emitting devices, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
    a light emitting layer including an active layer;
    a light transmitting layer transmittable with respect to light emitted from the light emitting layer, the light transmitting layer being amorphous and including silicon oxide; and
    a first semiconductor layer of a first conductivity type, the first semiconductor layer including silicon, the first semiconductor layer being provided between the light emitting layer and the light transmitting layer, the first semiconductor layer directly contacting the light transmitting layer, the first semiconductor layer having a thermal expansion coefficient larger than a thermal expansion coefficient of the light transmitting layer, having a lattice constant smaller than a lattice constant of the active layer, and having a tensile stress in an in-plane direction,
    wherein the light emitted from the light emitting layer passes through the light transmitting layer and is output to an outside of the semiconductor light emitting device.

2. The device according to claim 1, wherein the light transmitting layer includes silicon dioxide.

3. The device according to claim 1, wherein a wavelength of the light emitted from the light emitting layer is 410 nanometers or more and 550 nanometers or less.

4. The device according to claim 1, wherein
    the active layer includes InGaN, and
    the first semiconductor layer includes GaN.

5. The device according to claim 1, further comprising:
    a reflecting layer configured to reflect the light,
    the light transmitting layer being disposed between the first semiconductor layer and the reflecting layer.

6. The device according to claim 5, further comprising:
    a second semiconductor layer having a second conductivity type different from the first conductivity type; and
    an electrode electrically connected to the second semiconductor layer and being transmittable with respect to the light emitted from the light emitting layer,
    the light emitting layer being disposed between the first semiconductor layer and the second semiconductor layer, and
    the second semiconductor layer being disposed between the electrode and the light emitting layer.

7. The device according to claim 1, further comprising:
    a second semiconductor layer having a second conductivity type different from the first conductivity type,
    the light emitting layer being disposed between the first semiconductor layer and the second semiconductor layer.

8. The device according to claim 1, wherein
    the light emitting layer further includes a plurality of barrier layers having a bandgap energy larger than a bandgap energy of the active layer, and
    the active layer is provided between the barrier layers.

9. The device according to claim 1, wherein
    the light emitting layer includes a plurality of the active layers,
    the light emitting layer further includes a plurality of barrier layers having a bandgap energy larger than a bandgap energy of the active layers, and
    each of the active layers is disposed between each of the barrier layers.

10. The device according to claim 1, wherein
    the first semiconductor layer includes a first portion near the light transmitting layer and a second portion provided between the first portion and the light emitting layer, and
    a concentration of silicon in the first portion is higher than a concentration of silicon in the second portion.

11. The device according to claim 1, wherein
    the first semiconductor is formed on a silicon layer provided on a light transmitting film serving as the light transmitting layer, and the first semiconductor layer is made to contact the light transmitting film by eliminating the silicon layer after formation of the first semiconductor layer.

12. The device according to claim 11, wherein a thickness of the silicon layer is 2 nanometers or more and 20 nanometers or less.

13. The device according to claim 11, wherein the first semiconductor layer contains silicon atoms introduced from the silicon layer.

14. The device according to claim 11, wherein the elimination of the silicon layer includes an incorporation of silicon atoms in the silicon layer into the first semiconductor layer by increasing a temperature of the silicon layer.

15. The device according to claim 1, wherein the tensile stress in the in-plane has a component in a direction intersecting a direction from the first semiconductor layer toward the light transmitting layer.

16. The device according to claim 1, wherein the tensile stress in the in-plane has an in-plane components in a direction perpendicular to a direction from the first semiconductor layer toward the light transmitting layer.

17. The device according to claim 1, wherein the tensile stress in the in-plane is a stress parallel to a (0001) plane of the first semiconductor layer.

18. The device according to claim 1, wherein the first semiconductor layer is made of a GaN layer, and the GaN layer has a Raman shift smaller than 568 $cm^{-1}$.

19. The device according to claim 18, wherein the first semiconductor layer is epitaxially grown on the light transmitting layer continuously.

20. The device according to claim 1, wherein the first semiconductor layer is made of a first nitride semiconductor layer having the tensile stress in the in-plane direction, the first nitride semiconductor layer having a first Raman shift,
a second nitride semiconductor has a second Raman shift, the second nitride semiconductor has no stress and a same chemical composition as the first nitride semiconductor layer, and
the first Raman shift is smaller than the second Raman shift.

21. The device according to claim 20, wherein the first semiconductor layer is epitaxially grown on the light transmitting layer continuously.

22. The device according to claim 8, wherein each of the plurality of barrier layers is thicker than the active layer.

* * * * *